(12) United States Patent
Komatsu

(10) Patent No.: US 12,356,657 B2
(45) Date of Patent: Jul. 8, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Kanako Komatsu, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 92 days.

(21) Appl. No.: 17/677,578

(22) Filed: Feb. 22, 2022

(65) Prior Publication Data

US 2022/0181486 A1 Jun. 9, 2022

Related U.S. Application Data

(62) Division of application No. 16/702,790, filed on Dec. 4, 2019, now abandoned.

(30) Foreign Application Priority Data

Sep. 17, 2019 (JP) .................................. 2019-168401

(51) Int. Cl.
*H10D 30/65* (2025.01)
*H10D 30/60* (2025.01)
(Continued)

(52) U.S. Cl.
CPC .......... *H10D 30/65* (2025.01); *H10D 30/603* (2025.01); *H10D 30/66* (2025.01); *H10D 62/115* (2025.01); *H10D 62/116* (2025.01); *H10D 62/124* (2025.01); *H10D 62/151* (2025.01); *H10D 64/111* (2025.01); *H10D 64/519* (2025.01); *H10D 64/516* (2025.01)

(58) Field of Classification Search
CPC ............. H01L 29/0649; H01L 29/0653; H01L 29/0684; H01L 29/0847; H01L 29/402; H01L 29/42368; H01L 29/4238; H01L 29/7816–7826; H01L 29/7835; H01L 29/0692; H01L 29/7802
See application file for complete search history.

(56) References Cited

U.S. PATENT DOCUMENTS 9,761,714 B2 9/2017 Mori
2012/0098062 A1 4/2012 Pendharkar et al.
(Continued)

FOREIGN PATENT DOCUMENTS

JP H11-261066 A 9/1999
JP 2014-27062 A 2/2014
JP 2015-216218 A 12/2015

*Primary Examiner* — Timor Karimy
(74) *Attorney, Agent, or Firm* — Maier & Maier, PLLC

(57) ABSTRACT

A semiconductor device includes a semiconductor substrate, an insulating member provided on the semiconductor substrate and an electrode disposed on the semiconductor substrate and on the insulating member. The insulating member includes a plurality of first portions and a plurality of second portions thinner than the first portions. The first portions and the second portions are arranged alternately along a first direction, the first direction being parallel to a region of an upper surface of the semiconductor substrate not contacting the insulating member.

1 Claim, 15 Drawing Sheets

(51) Int. Cl.
*H10D 30/66* (2025.01)
*H10D 62/10* (2025.01)
*H10D 62/13* (2025.01)
*H10D 64/00* (2025.01)
*H10D 64/27* (2025.01)

(56) References Cited

U.S. PATENT DOCUMENTS

2017/0104097 A1* 4/2017 Park .................... H01L 29/7835
2017/0194489 A1   7/2017 Park et al.
2019/0288063 A1* 9/2019 Komatsu ............ H01L 29/0696

* cited by examiner

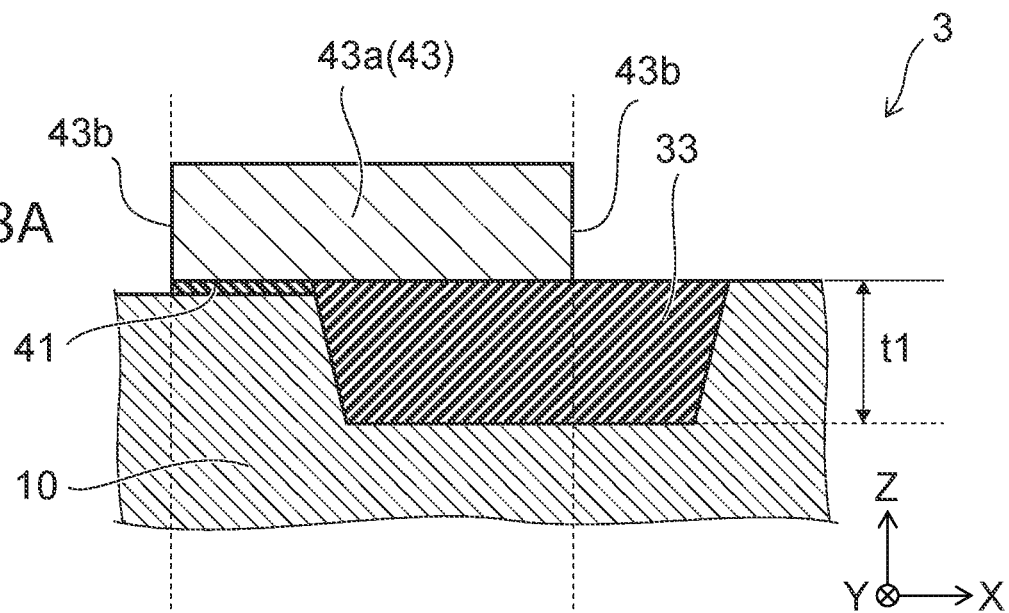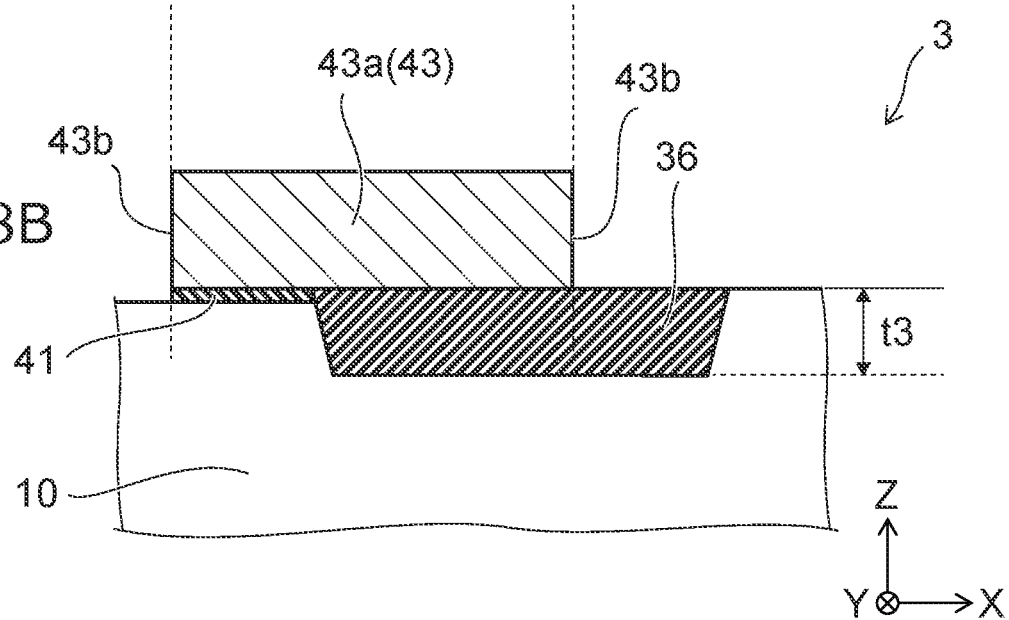

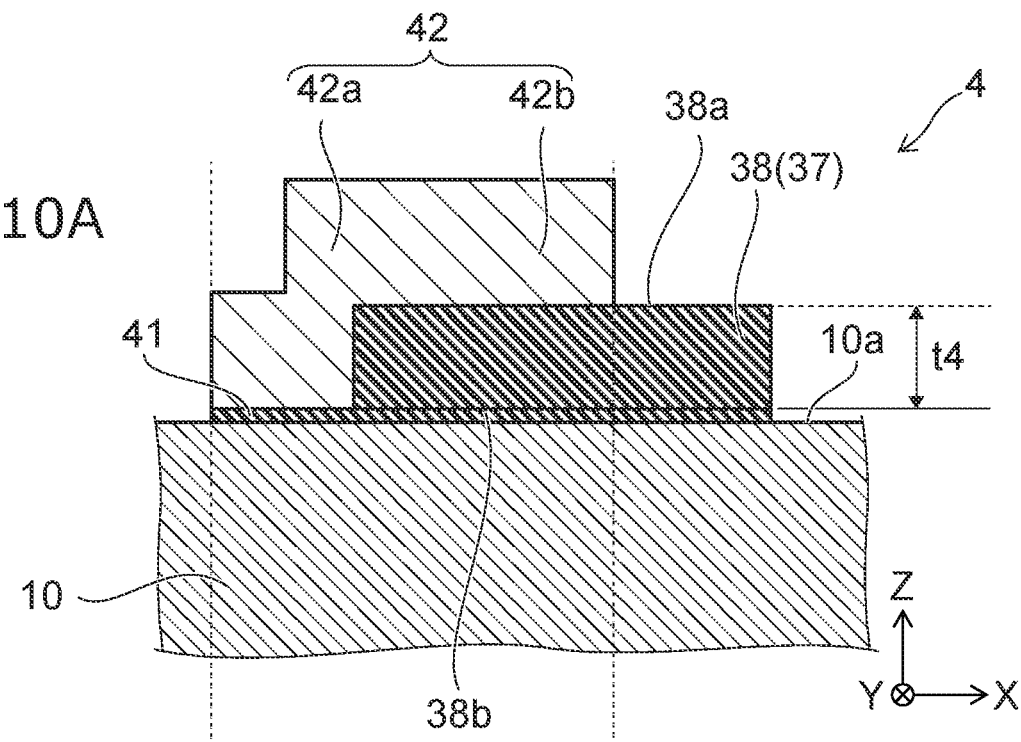
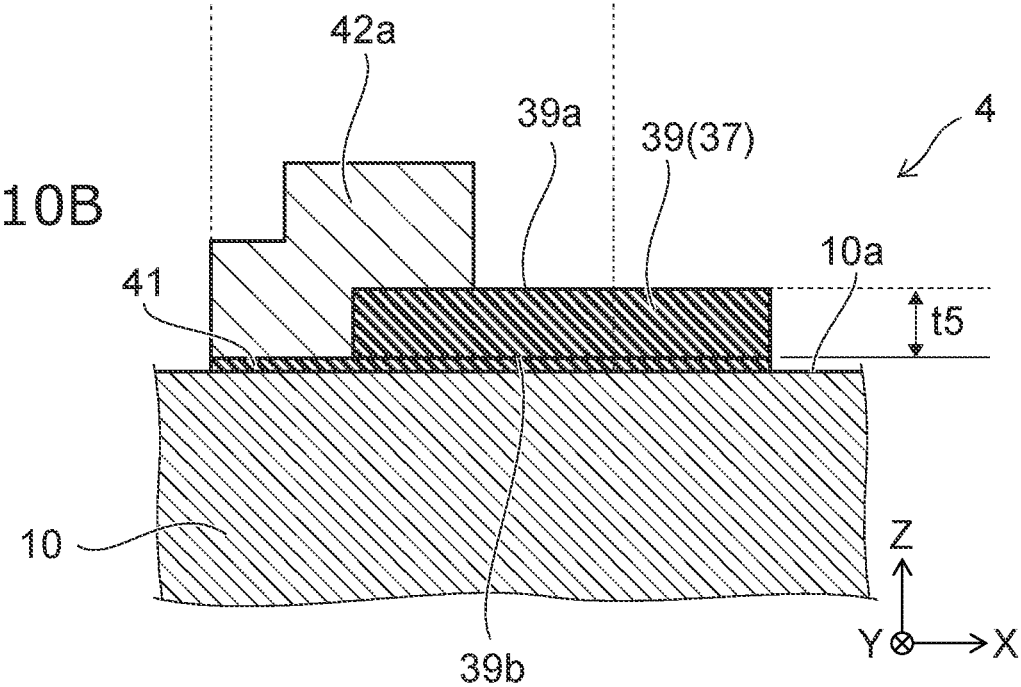

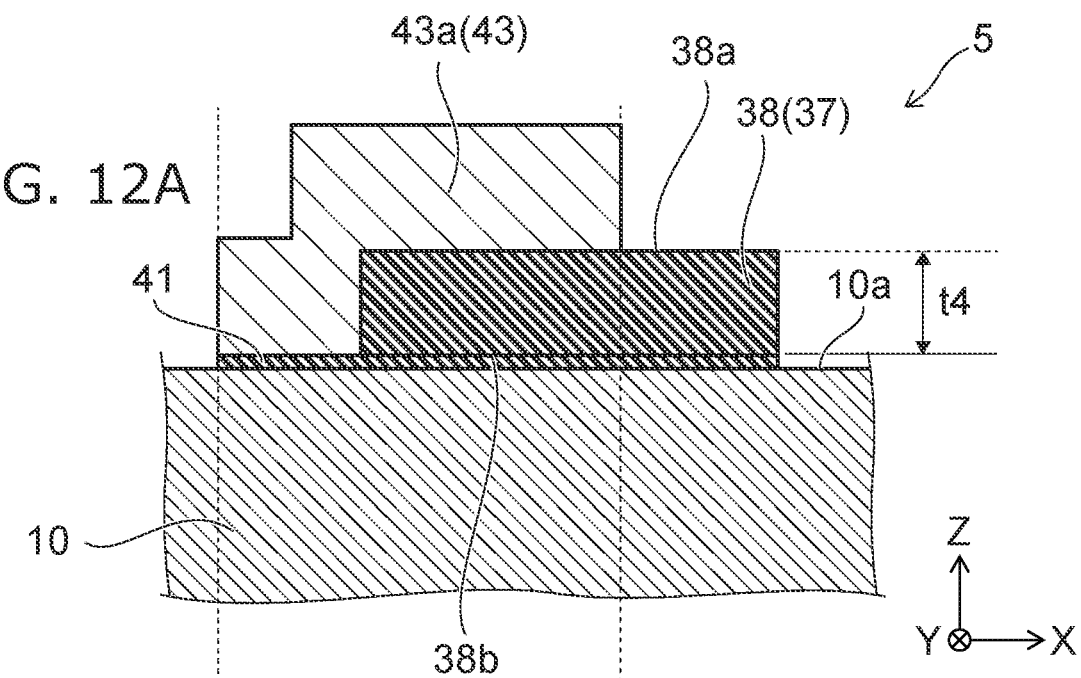
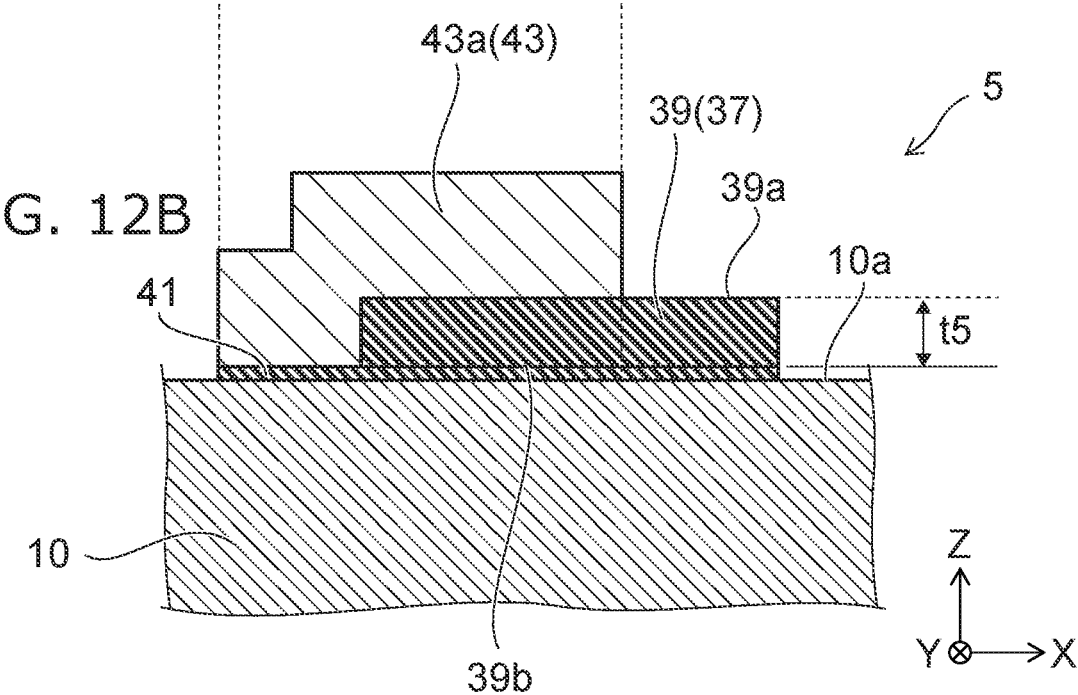

SEMICONDUCTOR DEVICE

CROSS-REFERENCE TO RELATED APPLICATIONS

This application is a divisional of U.S. application Ser. No. 16/702,790 filed on Dec. 4, 2019 and is based upon and claims the benefit of priority from the prior Japanese Patent Application No. 2019-168401, filed on Sep. 17, 2019; the entire contents of which are incorporated herein by reference.

FIELD

Embodiments relate to a semiconductor device.

BACKGROUND

Technology has been proposed for a DMOS (Double-Diffused MOSFET) in which STI (Shallow Trench Isolation; an element separation insulator) is provided between a drain and a channel to ensure the breakdown voltage. On the other hand, the ON-resistance increases due to the existence of the STI.

BRIEF DESCRIPTION OF THE DRAWINGS

FIGS. 8A and 8B are cross-sectional views showing a semiconductor device according to a third embodiment;

FIGS. 10A and 10B are cross-sectional views showing a semiconductor device according to a fourth embodiment;

FIGS. 12A and 12B are cross-sectional views showing a semiconductor device according to a fifth embodiment;

DETAILED DESCRIPTION

In general, a semiconductor device according to one embodiment includes a semiconductor substrate, an insulating member provided on the semiconductor substrate and an electrode disposed on the semiconductor substrate and on the insulating member. The insulating member includes a plurality of first portions and a plurality of second portions thinner than the first portions. The first portions and the second portions are arranged alternately along a first direction, the first direction being parallel to a region of an upper surface of the semiconductor substrate not contacting the insulating member.

First Embodiment

A first embodiment will now be described.

Figure 1:
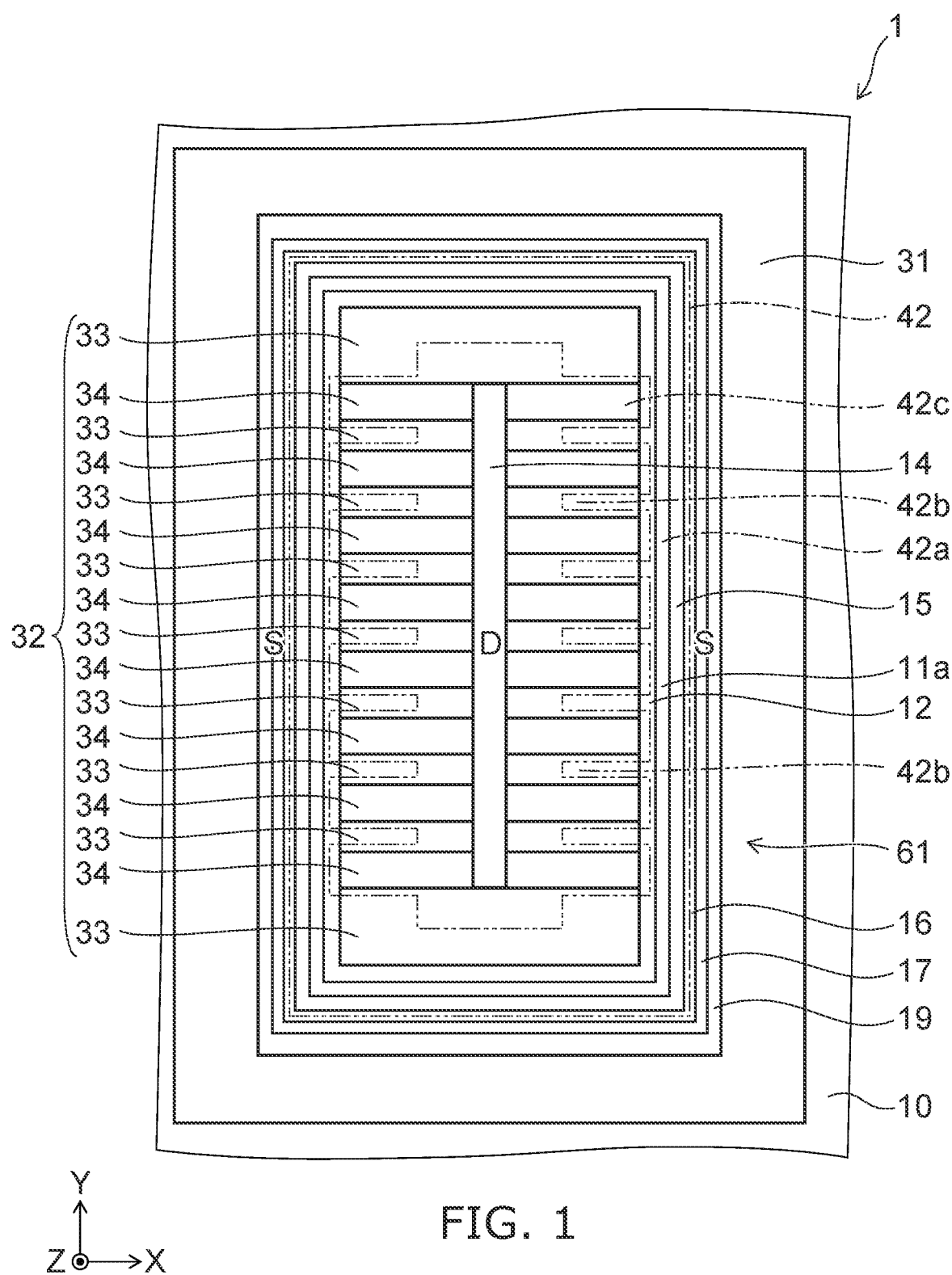
FIG. 1 is a plan view showing a semiconductor device according to a first embodiment.

FIG. 1 is a plan view showing a semiconductor device according to the embodiment.

Figure 2:
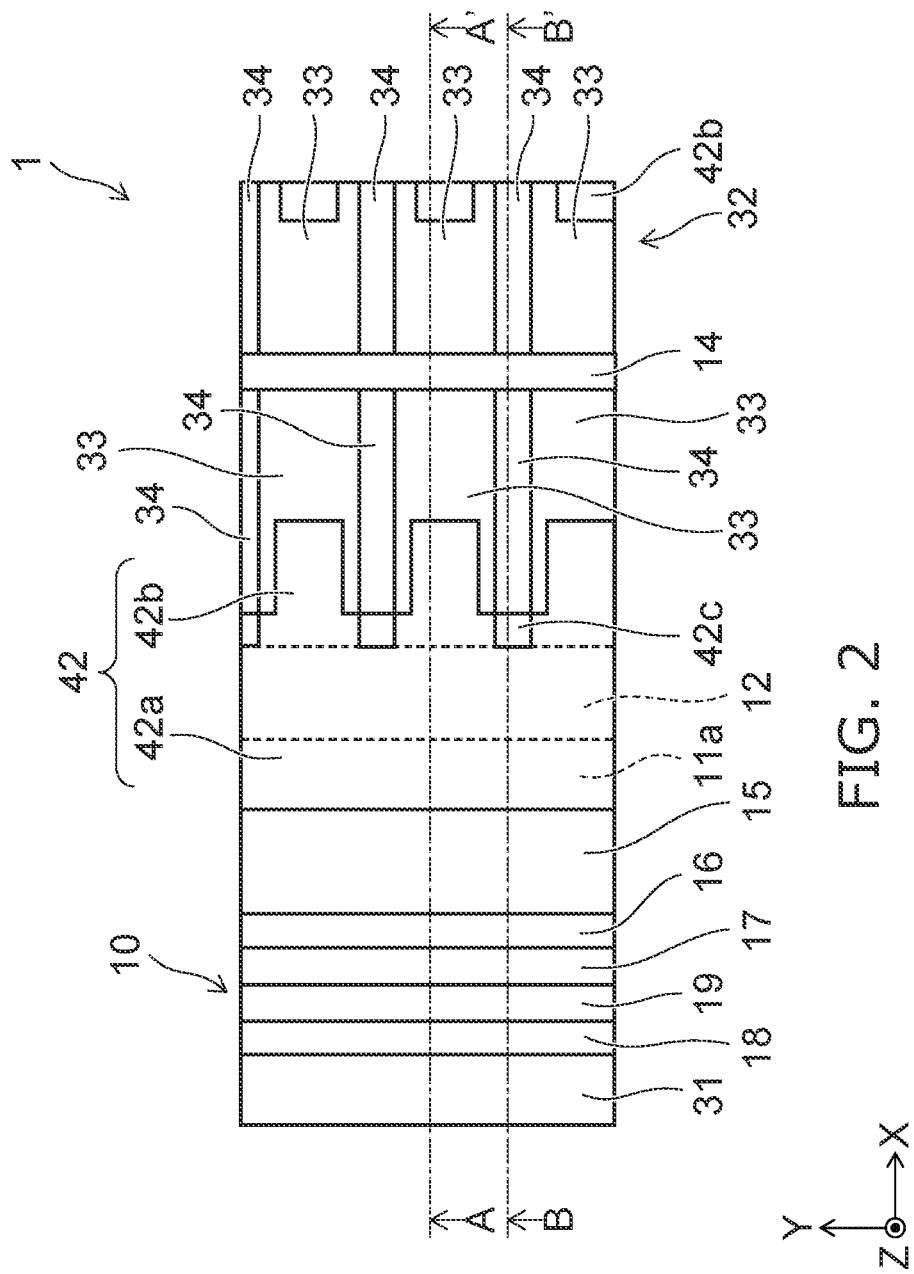
FIG. 2 is a partially enlarged plan view showing the semiconductor device according to the first embodiment.

FIG. 2 is a partially enlarged plan view showing the semiconductor device according to the embodiment.

Figure 3:
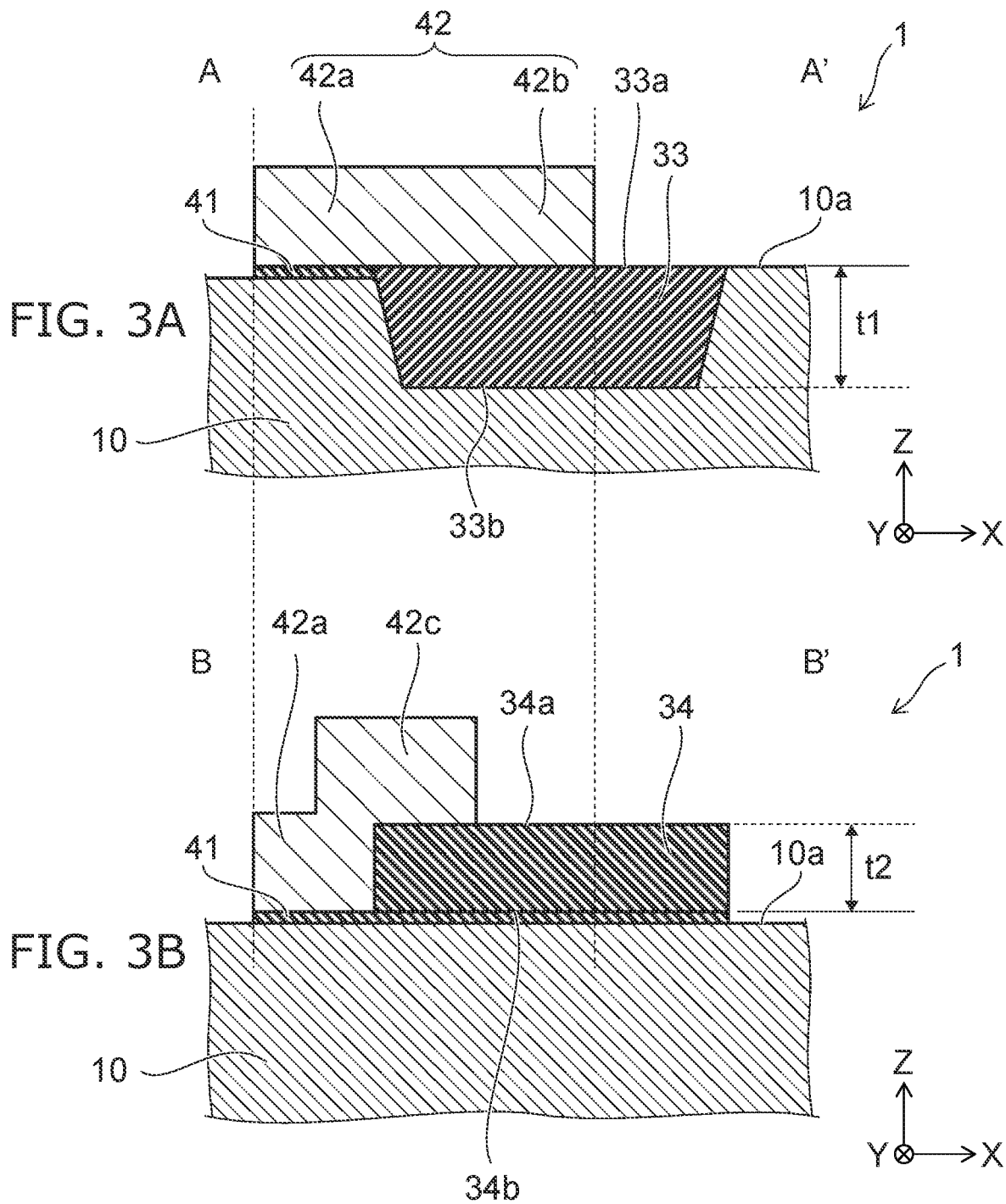
FIG. 3A is a cross-sectional view along line A-A' shown in FIG. 2.
FIG. 3B is a cross-sectional view along line B-B' shown in FIG. 2.

FIG. 3A is a cross-sectional view along line A-A' shown in FIG. 2; and FIG. 3B is a cross-sectional view along line B-B' shown in FIG. 2.

Figure 4:
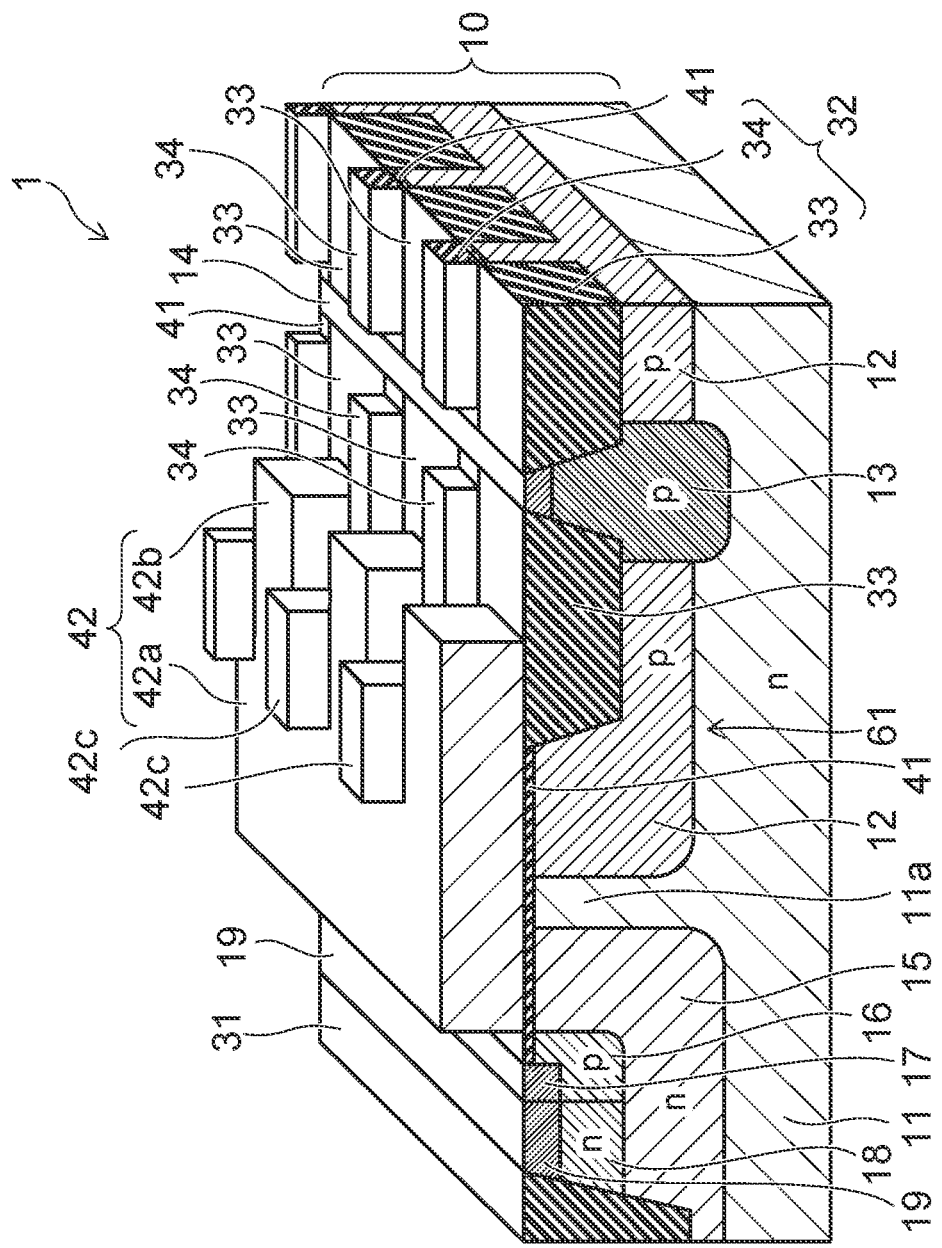
FIG. 4 is a perspective cross-sectional view showing the semiconductor device according to the first embodiment.

FIG. 4 is a perspective cross-sectional view showing the semiconductor device according to the embodiment.

The drawings are schematic and are drawn with appropriate exaggerations or omissions. For example, in FIGS. 3A and 3B, only a silicon substrate 10, a first portion 33 and a second portion 34 of an insulating member 32, and a gate electrode 42 described below are shown for easier viewing of the drawing. This is similar for FIGS. 6A and 6B, FIGS. 8A and 8B, FIGS. 10A and 10B, FIGS. 12A and 12B, and FIGS. 14A and 14B as well. The vertical-horizontal ratios of the components do not always match between the drawings.

In the semiconductor device 1 according to the embodiment as shown in FIG. 1, FIG. 2, FIGS. 3A and 3B, and FIG. 4, the silicon substrate 10 is provided as a semiconductor substrate. For example, the silicon substrate 10 is made of single-crystal silicon (Si). A deep n-well 11 which is of an n-conductivity type is provided in a portion of the upper layer portion of the silicon substrate 10. The conductivity type of the portion of the silicon substrate 10 surrounding the deep n-well 11 may be a p-type.

In the specification, an XYZ orthogonal coordinate system is employed for convenience of description. Two mutually-orthogonal directions parallel to an upper surface 10a of the silicon substrate 10 are taken as an "X-direction" and a "Y-direction"; and a direction perpendicular to the upper surface 10a is taken as a "Z-direction." The Z-direction also is called the "vertical direction." In the Z-direction, the direction away from the silicon substrate 10 as referenced to the upper surface 10a also is called "up"; and the direction into the silicon substrate 10 as referenced to the upper surface 10a also is called "down."

A drift layer 12 of the p-conductivity type and a p-well 13 of the p-conductivity type are provided in a central portion on the deep n-well 11. The impurity concentration of the p-well 13 is higher than the impurity concentration of the drift layer 12. The "impurity concentration" is the concentration of an impurity used as carriers inside the silicon. When viewed from above, for example, the drift layer 12 and the p-well 13 have rectangular configurations extending in the Y-direction. In the example shown in FIG. 4, the p-well 13 pierces the central portion of the drift layer 12; and the lower surface of the p-well 13 is positioned lower than the lower surface of the drift layer 12. However, this is not limited thereto; and the lower surface of the p-well 13 may be positioned higher than the lower surface of the drift layer 12. A drain contact layer 14 of the p-conductivity type is provided on the p-well 13. The impurity concentration of the drain contact layer 14 is higher than the impurity concentration of the p-well 13. The drain contact layer 14 also extends in the Y-direction parallel to the upper surface 10a of the silicon substrate 10.

An n-well 15 of the n-conductivity type is provided in a peripheral portion on the deep n-well 11. When viewed from above, for example, the n-well 15 has a rectangular frame-shaped configuration surrounding the drift layer 12 and the p-well 13. The n-well 15 is separated from the drift layer 12 and separated from the outer surface of the deep n-well 11. A portion 11a of the deep n-well 11 is disposed between the drift layer 12 and the n-well 15.

A source layer 16 of the p-conductivity type is provided at a portion on the n-well 15. A source contact layer 17 of the p-conductivity type is provided at a portion on the source layer 16. The impurity concentration of the source contact layer 17 is higher than the impurity concentration of the source layer 16. The source contact layer 17 extends in the Y-direction parallel to the upper surface 10a of the silicon substrate 10. A body layer 18 of the n-conductivity type is provided in another portion on the n-well 15. The impurity concentration of the body layer 18 is higher than the impurity concentration of the n-well 15. The body layer 18 contacts the source layer 16. A body contact layer 19 of the n-conductivity type is provided at a portion on the body layer 18. The impurity concentration of the body contact layer 19 is higher than the impurity concentration of the body layer 18. The body contact layer 19 contacts the source contact layer 17.

When viewed from above, for example, the source layer 16, the source contact layer 17, the body layer 18, and the body contact layer 19 have frame-shaped configurations surrounded with the n-well 15. The deep n-well 11, the drift layer 12, the p-well 13, the drain contact layer 14, the n-well 15, the source layer 16, the source contact layer 17, the body layer 18, and the body contact layer 19 are portions of the silicon substrate 10.

STI (Shallow Trench Isolation) 31 is provided as an element separation insulator on the silicon substrate 10. For example, the STI 31 is formed of silicon oxide (SiO). When viewed from above, for example, the STI 31 has a rectangular frame-shaped configuration and is disposed along the outer edge of the deep n-well 11. The outer edge of the deep n-well 11 contacts the bottom surface of the STI 31. Hereinbelow, the region that is surrounded with the STI 31 is called an "element region."

The insulating member 32 is provided on the silicon substrate 10. For example, the insulating member 32 is formed of silicon oxide. Multiple first portions 33 and multiple second portions 34 are provided in the insulating member 32. The insulating member 32 is disposed between the drain contact layer 14 and the source contact layer 17 or in the region directly above the region between the drain contact layer 14 and the source contact layer 17; for example, the insulating member 32 is disposed between the drain contact layer 14 and the portion 11a of the deep n-well 11 or in the region directly above the region between the drain contact layer 14 and the portion 11a of the deep n-well 11. The mutually-adjacent first portion 33 and second portion 34 contact each other.

In the Z-direction (the vertical direction), not less than half of the first portion 33 is disposed inside the silicon substrate 10. For example, in the Z-direction, substantially the entire first portion 33 is disposed inside the silicon substrate 10. A region of an upper surface 33a of the first portion 33 exists where the upper surface 33a is not covered with the silicon substrate 10. For example, the entire upper surface 33a is not covered with the silicon substrate 10. For example, the first portion 33 is formed in the same process as the STI 31.

In the Z-direction, not less than half of the second portion 34 is positioned higher than a region of the upper surface 10a of the silicon substrate 10 not contacting the insulating member 32. For example, in the Z-direction, substantially the entire second portion 34 is positioned higher than the region of the upper surface 10a not contacting the insulating member 32. Therefore, the upper surface 33a of the first portion 33 is positioned lower than an upper surface 34a of the second portion 34; and a lower surface 33b of the first portion 33 is positioned lower than a lower surface 34b of the second portion 34. For example, in the Z-direction, the position of the upper surface 33a of the first portion 33 is substantially the same as the position of the lower surface 34b of the second portion 34. The second portion 34 is, for example, a stepped oxide (STO) and is formed in a process different from that of the STI 31.

When viewed from above, the first portion 33 and the second portion 34 are arranged alternately along the Y-direction. In other words, the first portion 33 and the second portion 34 are arranged alternately along the Y-direction (the first direction) parallel to the region of the upper surface 10a of the silicon substrate 10 (the semiconductor substrate) not contacting the insulating member 32. For example, the first portion 33 and the second portion 34 are arranged periodically. The mutually-adjacent first portion 33 and second portion 34 contact each other. A thickness t2 of the second portion 34 is thinner than a thickness t1 of the first portion 33. In other words, t2<t1. The "thickness" means the length in the Z-direction.

A gate insulating film 41 which is made of, for example, silicon oxide is provided on the silicon substrate 10; and the gate electrode 42 is provided on the gate insulating film 41 and on the insulating member 32. The gate electrode 42 is disposed over at least a region directly above the n-well 15, a region directly above the portion 11a of the deep n-well 11, a region directly above the drift layer 12, a region directly above the first portion 33 of the insulating member 32, and a region directly above the second portion 34 of the insulating member 32. The gate insulating film 41 is thinner than the second portion 34 of the insulating member 32.

A sidewall is provided on the side surface of the gate electrode 42 and on the side surface of the second portion 34 of the insulating member 32. However, the sidewall is not illustrated for easier viewing of the drawings. This is similar for the other embodiments described below. The sidewall is made of an insulating material and is, for example, a stacked body of a silicon oxide layer and a silicon nitride layer. For example, the gate insulating film 41 is disposed between the silicon substrate 10 and the gate electrode 42, between the silicon substrate 10 and the sidewall, and between the silicon substrate 10 and the second portion 34. On the other hand, the gate insulating film 41 is not disposed between the silicon substrate 10 and the first portion 33. The gate insulating film 41 may be disposed between the silicon substrate 10 and the first portion 33.

When viewed from above, for example, the gate electrode 42 has a generally frame-shaped configuration including the region directly above the outer edge of the insulating member 32. In other words, a pair of X-side portions that extend in the X-direction and a pair of Y-side portions that extend in the Y-direction are provided in the gate electrode 42. The Y-side portions each have comb-shaped configurations. More specifically, a base portion 42a which has a band configuration extending in the Y-direction and multiple tooth portions 42b which extend in the X-direction from the base portion 42a toward the p-well 13 side (the drain side) are provided in each of the Y-side portions of the gate electrode 42. The multiple tooth portions 42b are separated from each other along the Y-direction and are, for example, arranged periodically.

In the vertical direction, that is, when viewed from above, the portion of the base portion 42a of the gate electrode 42 on the drain side overlaps both the first portion 33 and the second portion 34 of the insulating member 32. In the vertical direction, the tooth portion 42b overlaps the first portion 33; and the second portion 34 is positioned between the tooth portions 42b. A protruding portion 42c that reflects the configuration of the second portion 34 may be formed at the portion of the base portion 42a covering the second portion 34 of the insulating member 32. The protruding portion 42c may not be formed.

An inter-layer insulating film (not illustrated) is provided on the silicon substrate 10 to cover the gate electrode 42. Multiple contacts (not illustrated) and multiple interconnects (not illustrated) are provided inside the inter-layer insulating film. The interconnects are connected to the drain contact layer 14, the source contact layer 17, the body contact layer 19, the gate electrode 42, etc., via the contacts.

By such a configuration, a p-channel DMOS 61 is formed in the semiconductor device 1 inside the element region partitioned by the STI 31. The DMOS 61 includes the insulating member 32. A channel region is formed of the n-well 15 and the portion 11a of the deep n-well 11 in the DMOS 61. For convenience in FIG. 1, the source side of the DMOS 61 is marked with the reference numeral "S"; and the drain side of the DMOS 61 is marked with the reference numeral "D." In the DMOS 61, the direction from the source contact layer 17 toward the drain contact layer 14 is the X-direction.

Operations and effects of the semiconductor device 1 according to the embodiment will now be described.

In the DMOS 61, because the first portion 33 of the insulating member 32 is provided between the drain contact layer 14 and the channel region, a portion of the ON-current flowing in the source contact layer 17 from the drain contact layer 14 detours below the first portion 33. Therefore, in the DMOS 61, the drain-gate distance is long; and the breakdown voltage is high.

Also, because the tooth portions 42b of the gate electrode 42 are disposed on the first portions 33, the gate-drain distance can be ensured while relaxing the concentration of the electric field inside the drift layer 12 by the field plate effect; and the breakdown voltage can be increased.

Another portion of the ON-current flows through the region directly under the second portion 34 of the insulating member 32 and is not impeded by the first portion 33. Therefore, the ON-resistance of the DMOS 61 can be reduced. In this current path, the concentration of the electric field inside the drift layer 12 can be relaxed because the portion of the base portion 42a of the gate electrode 42 on the drain side is disposed on the second portion 34 of the insulating member 32.

According to the embodiment, the concentration of the electric field can be relaxed not only in the XZ plane but also in three-dimensional space including the Y-direction; and a DMOS that has excellent balance between the breakdown voltage and the ON-resistance can be realized.

Second Embodiment

A second embodiment will now be described.

Figure 5:
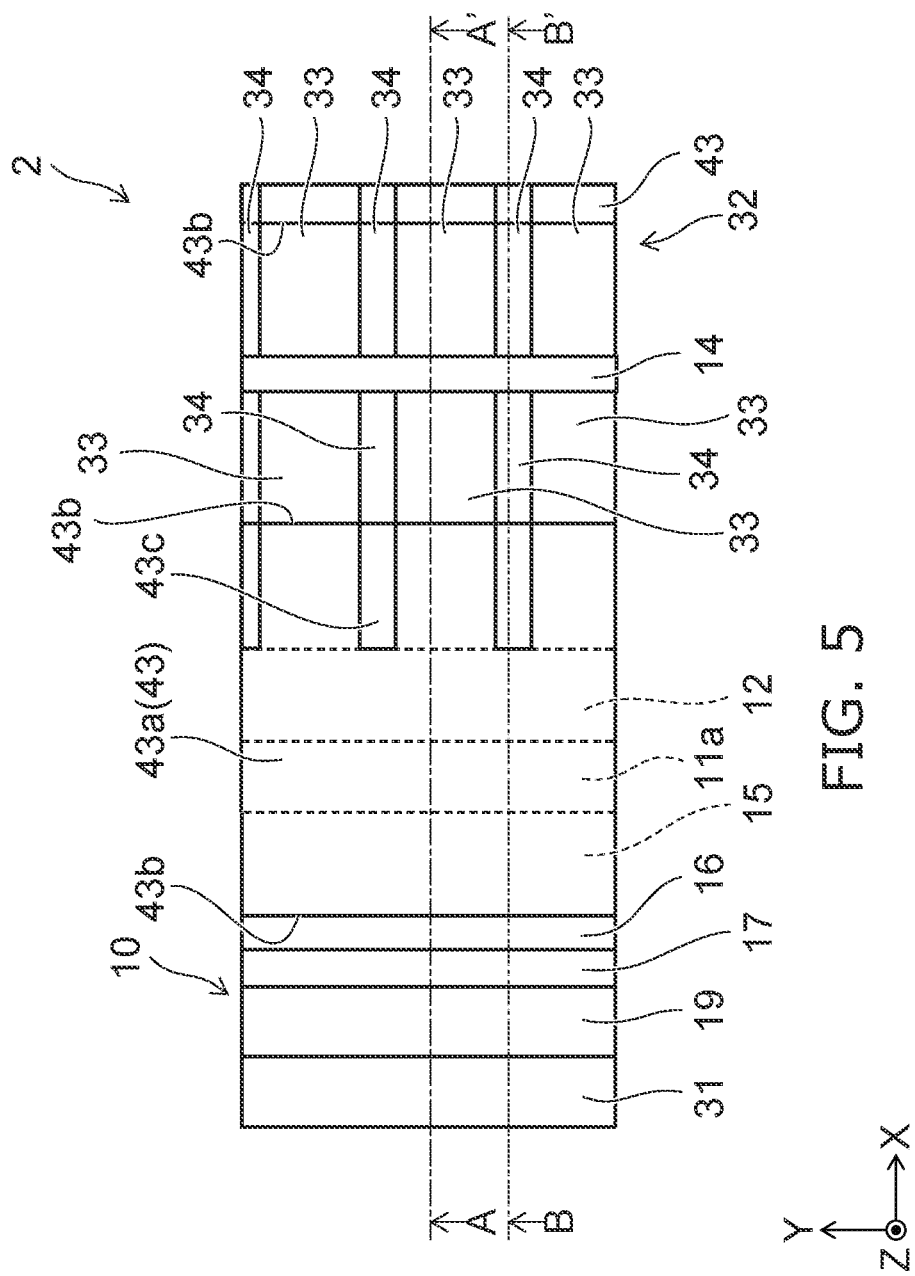
FIG. 5 is a partially enlarged plan view showing a semiconductor device according to a second embodiment.

FIG. 5 is a partially enlarged plan view showing a semiconductor device according to the embodiment.

Figure 6:
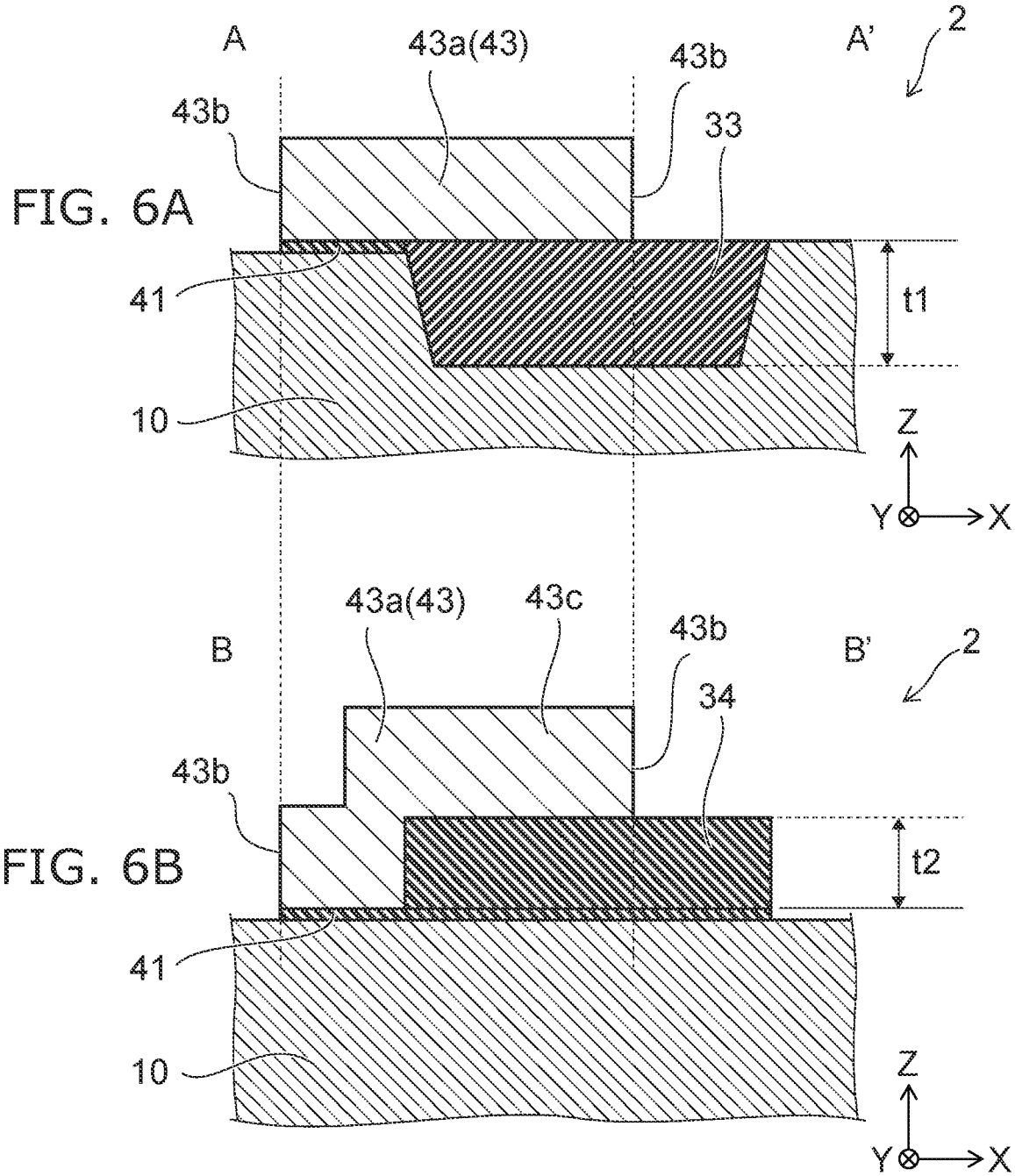
FIG. 6A is a cross-sectional view along line A-A' shown in FIG. 5.
FIG. 6B is a cross-sectional view along line B-B' shown in FIG. 5.

FIG. 6A is a cross-sectional view along line A-A' shown in FIG. 5; and FIG. 6B is a cross-sectional view along line B-B' shown in FIG. 5.

Figure 7:
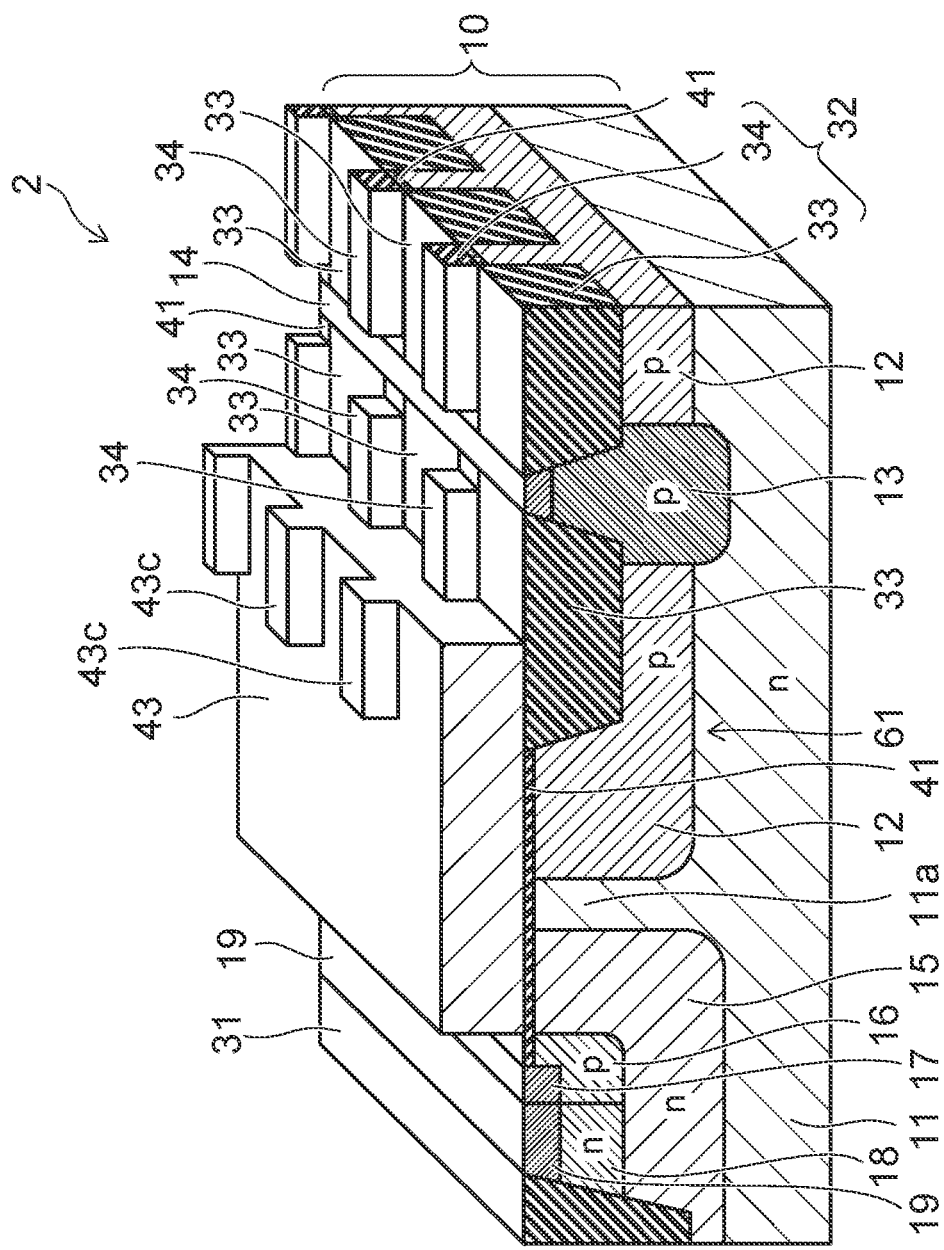
FIG. 7 is a perspective cross-sectional view showing the semiconductor device according to the second embodiment.

FIG. 7 is a perspective cross-sectional view showing the semiconductor device according to the embodiment.

As shown in FIG. 5, FIGS. 6A and 6B, and FIG. 7, the semiconductor device 2 according to the embodiment differs from the semiconductor device 1 according to the first embodiment (referring to FIG. 1 to FIG. 4) in that a gate electrode 43 is provided instead of the gate electrode 42.

When viewed from above, for example, the gate electrode 43 has a frame-shaped configuration. In the gate electrode 43, a band-shaped portion 43a is provided as a Y-side portion extending in the Y-direction. Two side surfaces 43b of the band-shaped portion 43a extend in linear configurations in the Y-direction. In other words, tooth portions such as those of the gate electrode 42 are not provided at the band-shaped portion 43a. A protruding portion 43c that reflects the configuration of the second portion 34 may be formed at the portion of the band-shaped portion 43a covering the second portion 34 of the insulating member 32. The protruding portion 43c may not be formed.

If the thickness t2 of the second portion 34 of the insulating member 32 is sufficiently thick, the necessary breakdown voltage can be ensured even without providing the tooth portions in the gate electrode 43. Otherwise, the configuration, the operations, and the effects of the embodiment are similar to those of the first embodiment. For example, the thickness t2 of the second portion 34 is thinner than the thickness t1 of the first portion 33. In other words, t2<t1. However, when the gate electrode 43 has a band configuration as in the embodiment, the thickness t2 of the second portion 34 may be thick and may be the same as the thickness t1 of the first portion 33. In other words, t2≥t1 is possible.

Third Embodiment

A third embodiment will now be described.

FIGS. 8A and 8B are cross-sectional views showing a semiconductor device according to the embodiment.

Figure 9:
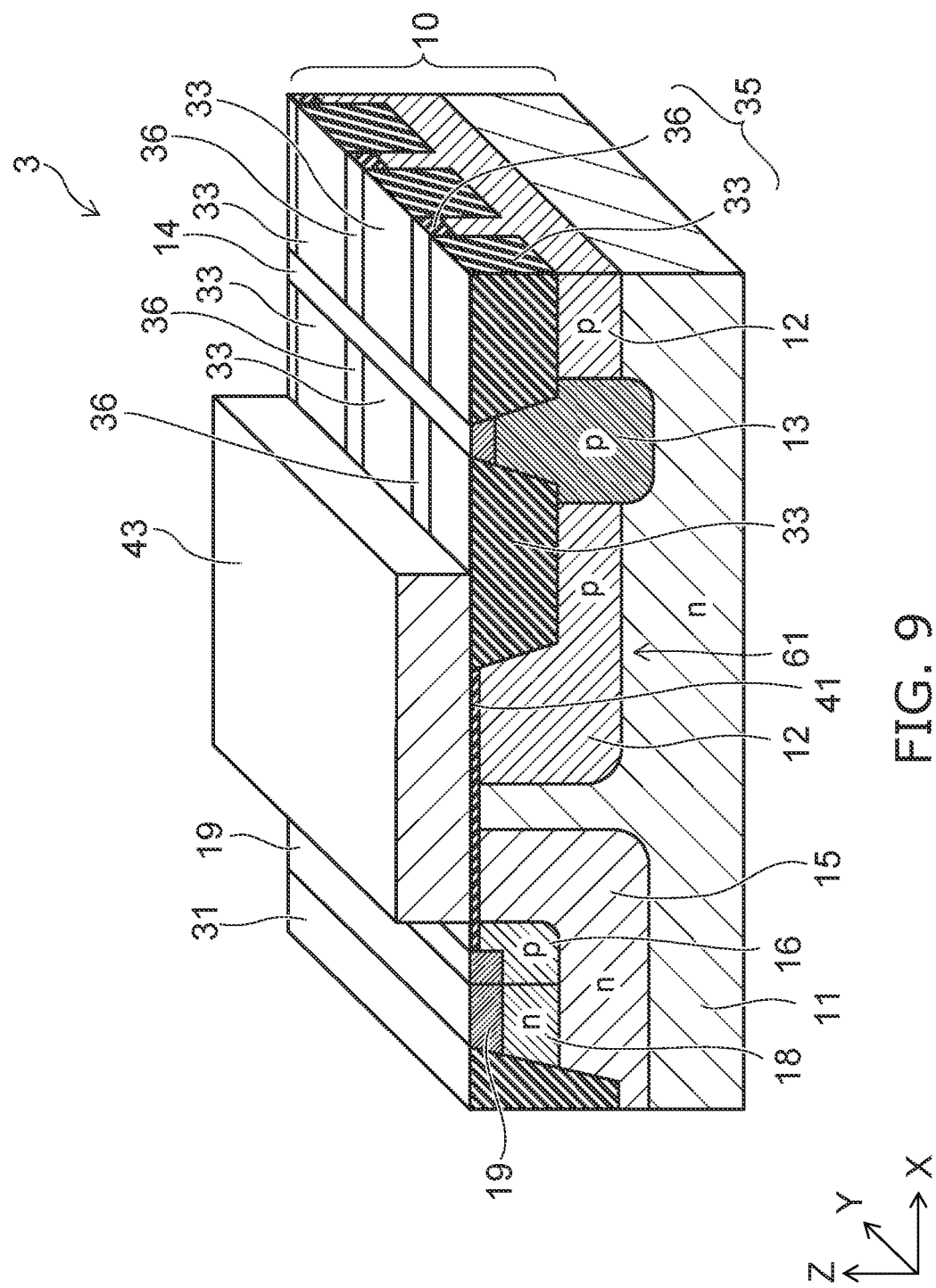
FIG. 9 is a perspective cross-sectional view showing the semiconductor device according to the third embodiment.

FIG. 9 is a perspective cross-sectional view showing the semiconductor device according to the embodiment.

The position of the cross section shown in FIG. 8A corresponds to line A-A' shown in FIG. 5; and the position of the cross section shown in FIG. 8B corresponds to line B-B' shown in FIG. 5.

As shown in FIGS. 8A and 8B and FIG. 9, the semiconductor device 3 according to the embodiment differs from the semiconductor device 2 according to the second embodiment (referring to FIG. 5, FIGS. 6A and 6B, and FIG. 7) in that an insulating member 35 is provided instead of the insulating member 32.

The multiple first portions 33 and multiple second portions 36 are provided in the insulating member 35. In the Z-direction, not less than half of the second portion 36 is disposed inside the silicon substrate 10. For example, in the Z-direction, substantially the entire second portion 36 is disposed inside the silicon substrate 10. Also, a region of an upper surface 36a of the second portion 36 may exist where the upper surface 36a is not covered with the silicon substrate 10. For example, the entire upper surface 36a is not covered with the silicon substrate 10. The position and the configuration of the first portion 33 are similar to those of the second embodiment.

Accordingly, in the Z-direction, not less than half of the insulating member 35, e.g., substantially the entirety, is disposed inside the silicon substrate 10. Also, a region of the upper surface of the insulating member 35 exists where the upper surface is not covered with the silicon substrate 10; for example, the entire upper surface of the insulating member 35 is not covered with the silicon substrate 10. For example, the second portion 36 is formed in the same process as one of the STIs provided in the semiconductor device 3. The multiple first portions 33 and the multiple second portions 36 are arranged alternately in the Y-direction. The mutually-adjacent first portion 33 and second portion 36 contact each other. A thickness t3 of the second portion 36 is thinner than the thickness t1 of the first portion 33. In other words, t3<t1. The gate insulating film 41 is thinner than the second portion 36.

Similarly to the second embodiment, the band-shaped portion 43a that extends in the Y-direction is provided in the gate electrode 43. The two side surfaces 43b of the band-shaped portion 43a extend in linear configurations in the Y-direction. However, the protruding portion 43c (referring to FIG. 7) is not formed at the band-shaped portion 43a. Otherwise, the configuration, the operations, and the effects of the embodiment are similar to those of the first embodiment.

Fourth Embodiment

A fourth embodiment will now be described.

FIGS. 10A and 10B are cross-sectional views showing a semiconductor device according to the embodiment.

Figure 11:
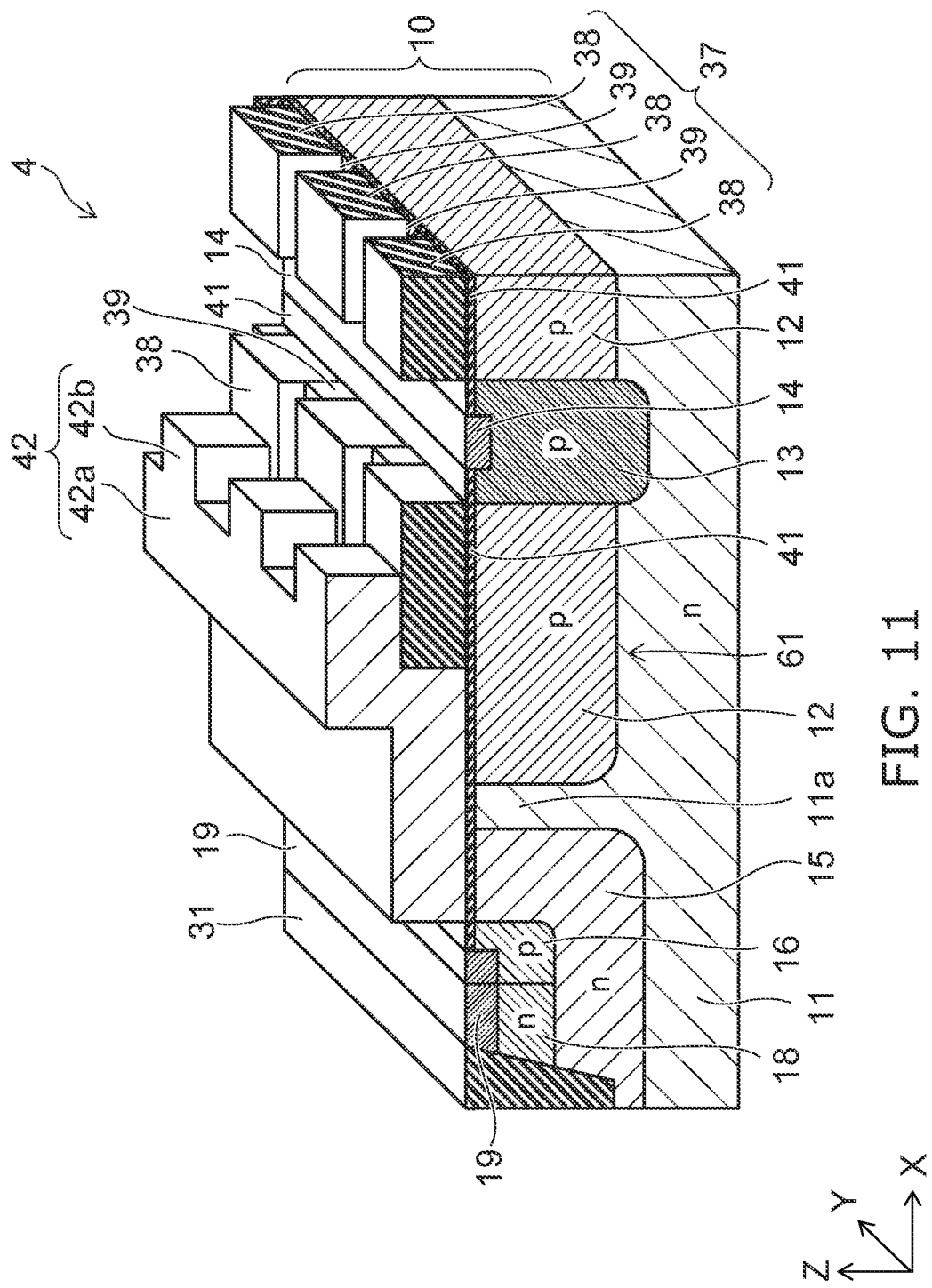
FIG. 11 is a perspective cross-sectional view showing the semiconductor device according to the fourth embodiment.

FIG. 11 is a perspective cross-sectional view showing the semiconductor device according to the embodiment.

The position of the cross section shown in FIG. 10A corresponds to line A-A' shown in FIG. 2; and the position of the cross section shown in FIG. 10B corresponds to line B-B' shown in FIG. 2.

As shown in FIGS. 10A and 10B and FIG. 11, the semiconductor device 4 according to the embodiment differs from the semiconductor device 1 according to the first embodiment (referring to FIG. 1 to FIG. 4) in that an insulating member 37 is provided instead of the insulating member 32. In the Z-direction, not less than half of the insulating member 37, e.g., substantially the entirety, is positioned higher than a region of the upper surface 10a of the silicon substrate 10 not contacting the insulating member 37. The insulating member 37 is formed of, for example, silicon oxide.

In the insulating member 37, multiple first portions 38 and multiple second portions 39 are arranged alternately and, for example, periodically along the Y-direction. The mutually-adjacent first portion 38 and second portion 39 contact each other. The first portion 38 and the second portion 39 of the insulating member 37 each is, for example, a stepped oxide. A thickness t5 of the second portion 39 is thinner than a thickness t4 of the first portion 38. In other words, t5<t4. The gate insulating film 41 is thinner than the second portion 39. An upper surface 38a of the first portion 38 is positioned higher than an upper surface 39a of the second portion 39. In the Z-direction, the position of a lower surface 38b of the first portion 38 is substantially the same as the position of a lower surface 39b of the second portion 39.

The gate electrode 42 is provided in the semiconductor device 4. When viewed from above, the configuration of the gate electrode 42 is similar to the configuration of the gate electrode 42 of the semiconductor device 1 according to the first embodiment. In other words, the Y-side portion of the gate electrode 42 has a comb-shaped configuration; and one base portion 42a extending in the Y-direction and multiple tooth portions 42b extending from the base portion 42a toward the X-direction drain side are provided.

The portion of the base portion 42a on the side opposite to the tooth portions 42b is disposed on the silicon substrate 10 with the gate insulating film 41 interposed. The portion of the base portion 42a at the tooth portion 42b side extends onto both the first portion 38 and the second portion 39 of the insulating member 37. The tooth portion 42b is disposed on the first portion 38 of the insulating member 37. Therefore, in the vertical direction, the tooth portion 42b overlaps the first portion 38; and the second portion 39 is positioned between the tooth portions 42b. An unevenness that reflects the configuration of the insulating member 37 may be formed in the upper surface of the gate electrode 42.

In the embodiment, the concentration of the electric field inside the silicon substrate 10 can be suppressed because the tooth portion 42b of the gate electrode 42 extends toward the drain side. Also, the drain-gate breakdown voltage can be ensured because the tooth portion 42b is disposed on the first portion 38 of the insulating member 37. Also, because the portion of the base portion 42a of the gate electrode 42 at the tooth portion 42b side is disposed on the first portion 38 and on the second portion 39 of the insulating member 37, the concentration of the electric field inside the silicon substrate 10 can be suppressed; and the breakdown voltage can be ensured.

In the embodiment, because the first portion 38 and the second portion 39 of the insulating member 37 are arranged alternately along the Y-direction, the electric field distribution inside the silicon substrate 10 can be controlled three-dimensionally. Otherwise, the configuration, the operations, and the effects of the embodiment are similar to those of the first embodiment.

Fifth Embodiment

A fifth embodiment will now be described.

FIGS. 12A and 12B are cross-sectional views showing a semiconductor device according to the embodiment.

Figure 13:
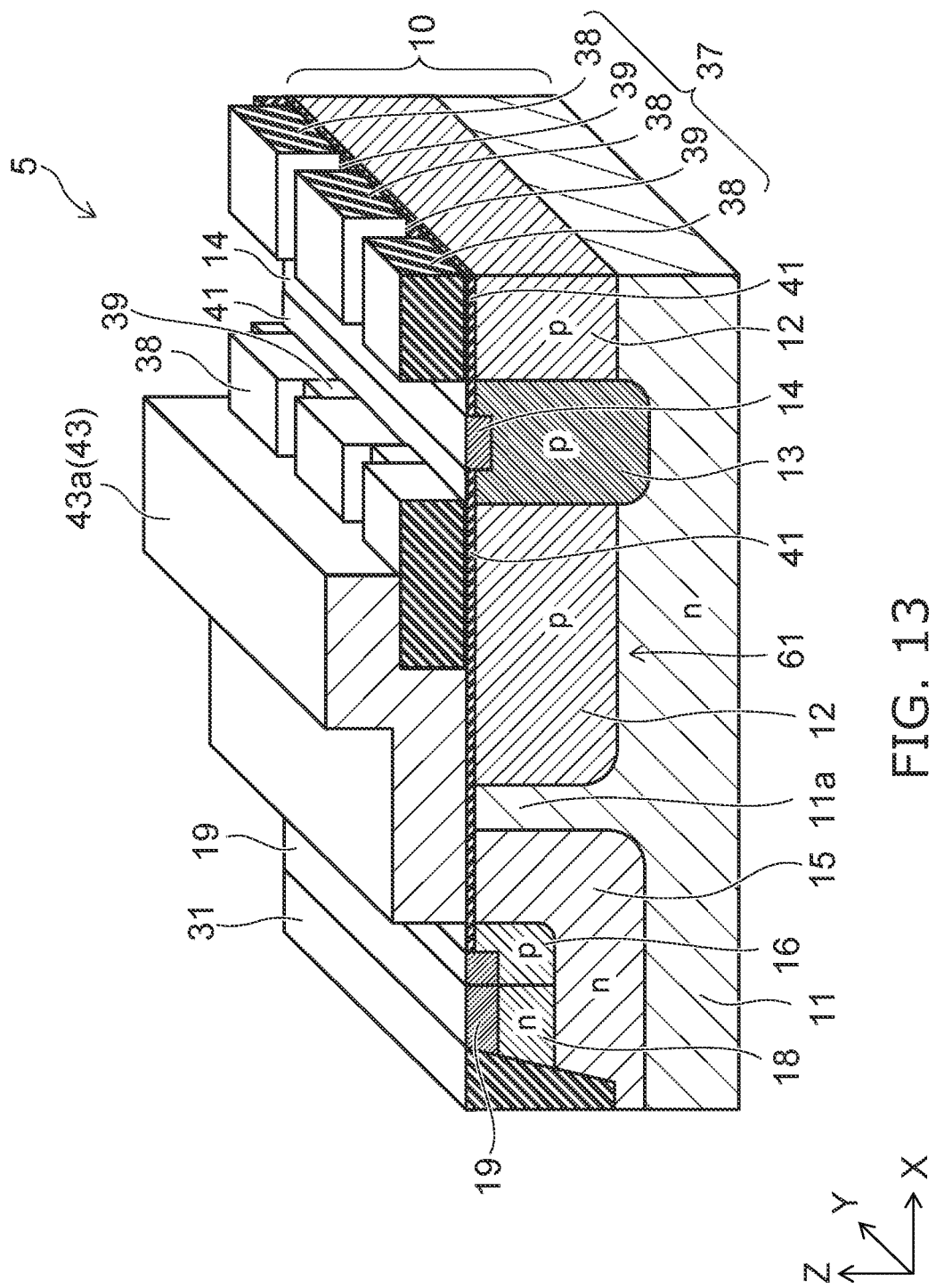
FIG. 13 is a perspective cross-sectional view showing the semiconductor device according to the fifth embodiment.

FIG. 13 is a perspective cross-sectional view showing the semiconductor device according to the embodiment.

The position of the cross section shown in FIG. 12A corresponds to line A-A' shown in FIG. 5; and the position of the cross section shown in FIG. 12B corresponds to line B-B' shown in FIG. 5.

The embodiment is an example in which the second embodiment and the fourth embodiment described above are combined. In other words, in the semiconductor device 5 according to the embodiment as shown in FIGS. 12A and 12B and FIG. 13, the insulating member 37 described in the fourth embodiment and the gate electrode 43 described in the second embodiment are provided.

Similarly to the fourth embodiment, the first portion 38 and the second portion 39, which is thinner than the first portion 38, are arranged alternately along the Y-direction in the insulating member 37. For each of the first portion 38 and the second portion 39, not less than half in the Z-direction, e.g., substantially the entirety, is disposed higher than the region of the upper surface 10a of the silicon substrate 10 not contacting the insulating member 37.

Similarly to the second embodiment, the band-shaped portion 43a that extends in the Y-direction is provided in the gate electrode 43. The portion of the band-shaped portion 43a at the source side is disposed on the silicon substrate 10 with the gate insulating film 41 interposed. The portion of the band-shaped portion 43a at the drain side extends onto the first portion 38 and onto the second portion 39 of the insulating member 37. An unevenness that reflects the configuration of the insulating member 37 may be formed in the upper surface of the gate electrode 43. Otherwise, the configuration, the operations, and the effects of the embodiment are similar to those of the first embodiment.

Sixth Embodiment

A sixth embodiment will now be described.

Figure 14A:
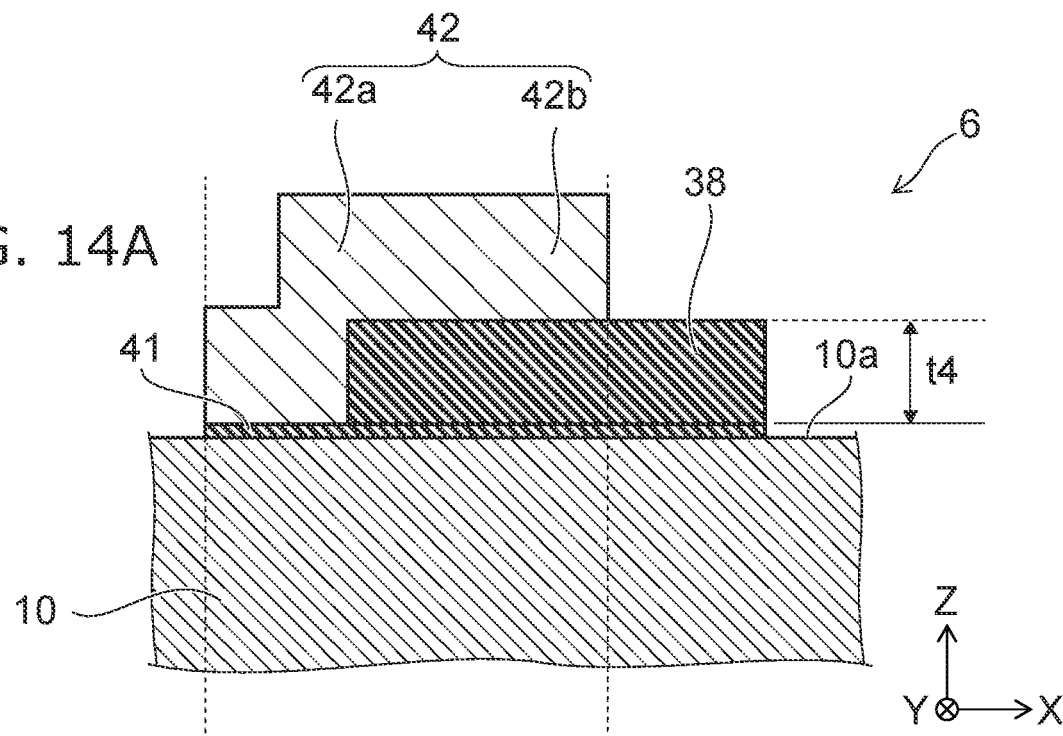
FIGS. 14A and 14B are cross-sectional views showing a semiconductor device according to a sixth embodiment.
Figure 14B:
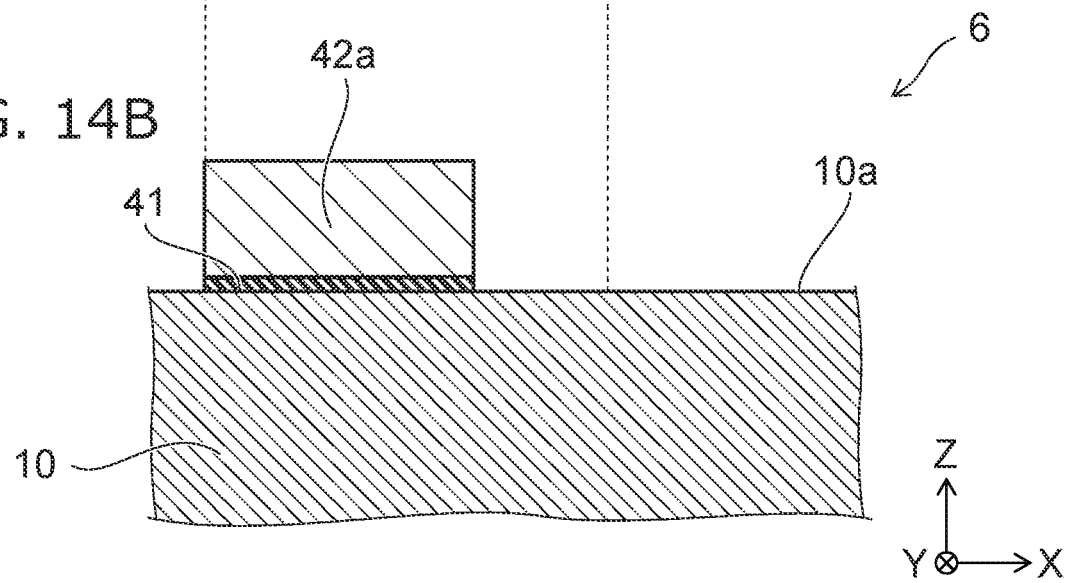

FIGS. 14A and 14B are cross-sectional views showing a semiconductor device according to the embodiment.

Figure 15:
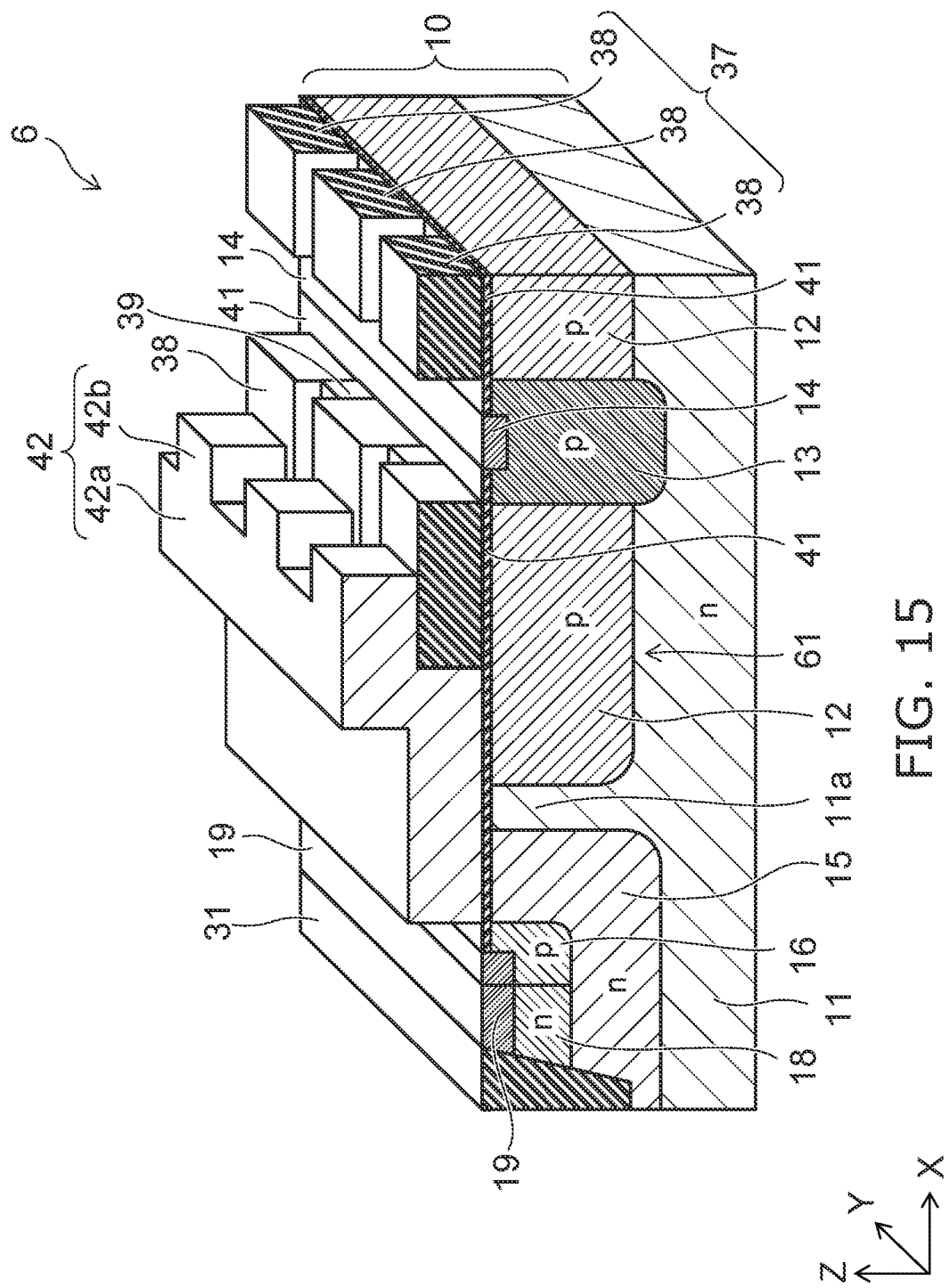
FIG. 15 is a perspective cross-sectional view showing the semiconductor device according to the sixth embodiment.

FIG. 15 is a perspective cross-sectional view showing the semiconductor device according to the embodiment.

The position of the cross section shown in FIG. 14A corresponds to line A-A' shown in FIG. 2; and the position of the cross section shown in FIG. 14B corresponds to line B-B' shown in FIG. 2.

As shown in FIGS. 14A and 14B and FIG. 15, the semiconductor device 6 according to the embodiment differs from the semiconductor device 4 according to the fourth embodiment (referring to FIGS. 10A and 10B and FIG. 11) in that the second portion 39 of the insulating member 37 is not provided. In other words, in the semiconductor device 4, only the first portions 38 of the insulating member 37 are arranged to be separated from each other along the Y-direction. The gate insulating film 41 is provided between the silicon substrate 10 and the first portion 38. Also, the gate insulating film 41 is provided between the silicon substrate 10 and the gate electrode 42 in the region between the first portions 38.

In other words, the silicon substrate 10, multiple insulating members (the first portions 38) provided on the silicon substrate 10 and arranged to be separated from each other along the Y-direction, and the gate electrode 42 disposed on the silicon substrate 10 and on the multiple insulating members (the first portions 38) are provided in the semiconductor device 6. Similarly to the fourth embodiment, the base portion 42a that extends in the Y-direction and the multiple tooth portions 42b that extend from the base portion 42a toward the X-direction drain side are provided at the Y-side portion of the gate electrode 42. In the vertical direction, the first portion 38 overlaps the tooth portion 42b; and the region between the first portions 38 overlaps the region between the tooth portions 42b.

According to the necessary breakdown voltage of the semiconductor device 6, the necessary ON-resistance and breakdown voltage can be realized even without providing the second portion 39 of the insulating member 37. Otherwise, the configuration, the operations, and the effects of the embodiment are similar to those of the first embodiment.

According to the embodiments described above, a semiconductor device that has excellent balance between the breakdown voltage and the ON-resistance can be realized.

While certain embodiments have been described, these embodiments have been presented by way of example only, and are not intended to limit the scope of the inventions. In deed, the novel embodiments described herein may be embo died in a variety of other forms; furthermore, various omissions, substitutions and changes in the form of the embodiment s described herein may be made without departing from the spirit of the inventions. The accompanying claims and their equivalents are intended to cover such forms or modifications as would fall within the scope and spirit of the inventions.

Although an example is shown in the embodiments described above in which a DMOS is provided in the semiconductor device, this is not limited thereto. For example, a LDMOS (Laterally Diffused MOS), a DEMOS (Drain Extended MOS), an EDMOS (Extended Drain MOS; an orthogonal gate extended drain MOS), or a high breakdown-voltage MOSFET (Metal-Oxide-Semiconductor Field-Effect Transistor) may be provided.

Although an example is shown in the embodiments described above in which a silicon substrate is used as the semiconductor substrate, this is not limited thereto. The semiconductor substrate may be, for example, a SiC substrate, a SiGe substrate, or a compound semiconductor substrate. Also, the conductivity types of the components may be reversed.

The invention includes the following aspects.

Note 1

A semiconductor device, comprising:
a semiconductor substrate;
a plurality of first insulating members disposed inside the semiconductor substrate, upper surfaces of a plurality of first insulating members being exposed at an upper surface of the semiconductor substrate;
a plurality of second insulating members provided on the semiconductor substrate; and
an electrode provided on the semiconductor substrate, on the first insulating members, and on the second insulating members,
the first insulating members and the second insulating members being arranged alternately along a first direction parallel to the upper surface of the semiconductor substrate.

Note 2

The semiconductor device according to Note 1, wherein the second insulating member is thinner than the first insulating member.

Note 3

A semiconductor device, comprising:
a semiconductor substrate;
an insulating member disposed inside the semiconductor substrate, an upper surface of the insulating member being exposed at an upper surface of the semiconductor substrate; and
an electrode provided on the semiconductor substrate and on the insulating member,
the insulating member including
a plurality of first portions, and
a plurality of second portions thinner than the first portions,
the first portions and the second portions being arranged alternately along a first direction parallel to the upper surface of the semiconductor substrate.

Note 4

A semiconductor device, comprising:
a semiconductor substrate;
an insulating member provided on the semiconductor substrate; and an electrode disposed on the semiconductor substrate and on the insulating member, the insulating member including
- a plurality of first portions, and
- a plurality of second portions thinner than the first portions, the first portions and the second portions being arranged alternately along a first direction parallel to an upper surface of the semiconductor substrate.

What is claimed is:

1. A semiconductor device, comprising:

a semiconductor substrate;

an insulating member disposed inside the semiconductor substrate, an upper surface of the insulating member being exposed at an upper surface of the semiconductor substrate; and an electrode provided on the semiconductor substrate and on the insulating member;

the insulating member including:
- a plurality of first portions, and
- a plurality of second portions thinner than the first portions;

the first portions and the second portions being arranged alternately one by one along a first direction, an upper surface of one of the plurality of first portions being at the same height as an upper surface of one of the plurality of second portions in a vertical direction, a lower surface of one of the plurality of first portions and a lower surface of one of the plurality of second portions directly physically contacting the semiconductor substrate, and the semiconductor substrate including:
- a source layer, and
- a drain layer;

the source layer and the drain layer being arranged along a second direction crossing the first direction, and the electrode is disposed directly above the plurality of first portions and directly above the plurality of second portions.

* * * * *